United States Patent
Lee (10) Patent No.: US 9,006,710 B2
(45) Date of Patent: Apr. 14, 2015

(54) TYPE-SWITCHING TRANSISTORS, ELECTRONIC DEVICES INCLUDING THE SAME, AND METHODS OF OPERATING THE TYPE-SWITCHING TRANSISTORS AND ELECTRONIC DEVICES

(75) Inventor: Eun-hong Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 20 days.

(21) Appl. No.: 13/449,771

(22) Filed: Apr. 18, 2012

(65) Prior Publication Data

US 2013/0088283 A1    Apr. 11, 2013

(30) Foreign Application Priority Data

Oct. 7, 2011    (KR) .................. 10-2011-0102654

(51) Int. Cl.
| | |
|---|---|
| H01L 29/06 | (2006.01) |
| H01L 51/05 | (2006.01) |
| H01L 29/16 | (2006.01) |
| H01L 29/786 | (2006.01) |
| B82Y 10/00 | (2011.01) |
| H01L 51/00 | (2006.01) |
| H01L 27/06 | (2006.01) |

(52) U.S. Cl.
CPC ........ H01L 51/0554 (2013.01); H01L 29/0673 (2013.01); H01L 29/1606 (2013.01); H01L 29/78645 (2013.01); H01L 29/78684 (2013.01); B82Y 10/00 (2013.01); *H01L 51/0048* (2013.01); *H01L 51/0558* (2013.01); *H01L 27/0629* (2013.01)

(58) Field of Classification Search
USPC ............... 257/29, 40, 411, 288, 410, 379, 257/E27.016, E29.082, E29.255; 438/197; 977/842, 938
See application file for complete search history.

(56) References Cited

U.S. PATENT DOCUMENTS

2011/0089995 A1*   4/2011   Heo et al. .................. 327/534

FOREIGN PATENT DOCUMENTS

| JP | 2001-168647 A | 6/2001 |
|---|---|---|
| JP | 2009-277803 A | 11/2009 |
| KR | 10-2010-0037407 A | 4/2010 |
| KR | 10-2010-0094192 A | 8/2010 |
| KR | 10-2011-0041791 A | 4/2011 |

OTHER PUBLICATIONS

"Carbon nanotubes: Logical switch", NPG Asia Materials, published online Jun. 15, 2009, pp. 1-2.
Woo Jung Yu et al., "Adaptive Logic Circuits with Doping-Free Ambipolar Carbon Nanotubes Transistors", Nano Letters 2009, Mar. 12, 2009, pp. 1401-1405, vol. 9, No. 4, ACS Publications.

* cited by examiner

*Primary Examiner* — Jose R Diaz
(74) *Attorney, Agent, or Firm* — Sughrue Mion, PLLC (57) ABSTRACT

Type-switching transistors, electronic devices including the same, and methods of operating thereof are provided. A type-switching transistor may include a plurality of gates corresponding to a channel layer. The plurality of gates may include a first gate for switching a type of the transistor and a second gate for controlling ON/OFF characteristics of the channel layer. The first and second gates may be disposed on one side of the channel layer so that the channel layer is not disposed between the first and second gates.

35 Claims, 8 Drawing Sheets

< COMPARATIVE EXAMPLE >

TYPE-SWITCHING TRANSISTORS, ELECTRONIC DEVICES INCLUDING THE SAME, AND METHODS OF OPERATING THE TYPE-SWITCHING TRANSISTORS AND ELECTRONIC DEVICES

CROSS-REFERENCE TO RELATED APPLICATION

This application claims priority from Korean Patent Application No. 10-2011-0102654, filed on Oct. 7, 2011 in the Korean Intellectual Property Office, the disclosure of which is incorporated herein in its entirety by reference.

BACKGROUND

1. Field

The present disclosure relates to transistors, electronic devices including the same, and methods of operating the transistors and the electronic devices.

2. Description of the Related Art

The degree of integration and the capacity of silicon (Si)-based semiconductor devices have rapidly increased and improved. However, due to limitations in various characteristics of Si-based materials and manufacturing processes, it is expected to be difficult to implement higher capacity and higher integration Si-based semiconductor devices in the future.

Thus, research for next generation devices that overcome such limitations in Si-based semiconductor devices has been carried out. For example, attempts have been made to manufacture high performance micro-devices by using carbon-based materials, such as carbon nanotubes (CNTs) or graphene. CNTs and graphene have been highlighted as materials that overcome limitations in general Si-based semiconductor devices.

SUMMARY

According to an aspect of an embodiment, there is provided a type-switching transistor including: a channel layer; a source electrode that contacts a first region of the channel layer; a drain electrode that contacts a second region of the channel layer; and a plurality of gates comprising: a first gate configured to switch a type of the transistor, and a second gate configured to control characteristics of the channel layer, wherein the first and second gates are disposed on a same side of the channel layer.

The channel layer may include an ambipolar material.

The channel layer may include a carbon nanotube (CNT).

The channel layer may include graphene.

A first voltage may be applied to the first gate, the transistor is configured to operate as an N-type transistor, and when a second voltage that is different from the first voltage is applied to the first gate, the transistor is configured to operate as a P-type transistor.

The transistor may be configured as an N-type transistor, if a third voltage is applied to the second gate, the channel layer is in an OFF state, and if a fourth voltage that is greater than the third voltage is applied to the second gate, the channel layer is in an ON state.

The transistor may be configured as a P-type transistor, if a fifth voltage is applied to the second gate, the channel layer is in an OFF state, and if a sixth voltage that is smaller than the fifth voltage is applied to the second gate, the channel layer is in an ON state.

The plurality of gates may be disposed on a surface of the channel layer.

The plurality of gates may be disposed above the channel layer.

The plurality of gates may be disposed below the channel layer.

The plurality of gates may be disposed in a lateral direction of the channel layer, and the first gate is disposed in a first position that is lower than the channel layer, and the second gate is disposed in a second position that is higher than the channel layer.

At least one of the first and second gates may not overlap the channel layer.

Centers of the first and second gates may be disposed in a same vertical line.

Centers of the first and second gates may be disposed in different vertical lines.

A distance between the first and second gates may be greater than or equal to 1 nm.

According to another aspect of an exemplary embodiment, there is provided a method of operating a type-switching transistor including a channel layer, a source electrode that contacts a first region of the channel layer, a drain electrode that contacts a second region of the channel layer, a first gate configured to switch a type of the transistor, and a second gate configured to control characteristics of the channel layer, wherein the first and second gates are disposed on a same side of the channel layer, the method including: switching a type of the transistor to a first type by applying a first voltage to the first gate; and driving the transistor using the second gate, the source electrode and the drain electrode.

The method may further include: switching the type of the transistor to a second type by applying a second voltage to the first gate; and driving the transistor by using the second gate, the source electrode and the drain electrode.

According to another aspect of an exemplary embodiment, there is provided an electronic device including a type-switching transistor that includes a channel layer, a source electrode that contacts a first region of the channel layer, a drain electrode that contacts a second region of the channel layer, a first gate configured to switch a type of the transistor, and a second gate configured to control characteristics of the channel layer, wherein the first and second gates are disposed on a same side of the gate insulating layer.

The electronic device may include a logic device.

The electronic device may include an inverter.

The inverter may be a resistor load type inverter comprising the type-switching transistor and a resistor connected to the type-switching transistor.

When the type-switching transistor is configured to operate as a first type transistor, the electronic device may output logic 0 in response to an input of logic 1, and when the type-switching transistor is configured to operate as a second type transistor, the electronic device may output logic 1 in response to an input of logic 1.

According to another aspect of an exemplary embodiment there is provided a logic device including: a type-switching transistor; and a resistor connected to the transistor, wherein when the type-switching transistor is configured as a first type, the logic device outputs logic 0 in response to an input of logic 1, and wherein when the type-switching transistor is configured as a second type, the logic device outputs logic 1 in response to the input of logic 1.

The type-switching transistor may include a plurality of gates, and the plurality of gates comprises a first gate configured to switch a type of the type-switching transistor and a second gate configured to control characteristics of a channel layer.

The channel layer may include a carbon-based material.
The channel layer may include a carbon nanotube (CNT).
The channel layer may include graphene.

According to another aspect of an exemplary embodiment, there is provided a type-switching transistor including: a channel layer; a gate insulating layer; a source electrode that contacts a first region of the channel layer; a drain electrode that contacts a second region of the channel layer; a first gate configured to switch a type of the transistor; and a second gate configured to control characteristics of the channel layer, wherein the first and second gates are disposed on a first side of the gate insulating layer and the channel layer is disposed on a second side of the gate insulating layer opposite the first side of the channel layer.

The gate insulating layer may be formed from one of a silicon oxide, a silicon oxynitride and a silicon nitride.

The gate insulating layer may be formed of a high-k material having a higher dielectric constant than silicon nitride.

The gate insulating layer may be a single layer structure.

If a first voltage is applied to the first gate, the transistor may be switched to an N-type transistor, and if a second voltage different from the first voltage is applied to the first gate, the transistor may be switched to a P-type transistor.

When the transistor is switched to an N-type transistor, the channel layer may be in an OFF state if a third voltage is applied to the second gate, and the channel layer may be in an ON state if a fourth voltage greater than the third voltage is applied to the second gate.

When the transistor is switched a P-type transistor, the channel layer may be in an OFF state if a fifth voltage is applied to the second gate, and the channel layer may be in an ON state if a sixth voltage that is smaller than the fifth voltage is applied to the second gate.

BRIEF DESCRIPTION OF THE DRAWINGS

The above and/or other aspects will become apparent and more readily appreciated from the following description of the embodiments, taken in conjunction with the accompanying drawings of which.

DETAILED DESCRIPTION

Various exemplary embodiments will now be described more fully with reference to the accompanying drawings.

It will be understood that when an element is referred to as being "connected" or "coupled" to another element, it can be directly connected or coupled to the other element or intervening elements may be present. By contrast, when an element is referred to as being "directly connected" or "directly coupled" to another element, there are no intervening elements present. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be oriented otherwise (e.g., rotated 90 degrees, or at some other orientation) and the spatially relative descriptors used herein should be interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device, and are also not intended to limit the scope of the exemplary embodiments.

Unless otherwise defined, all terms (including technical and scientific terms) used herein have the same meaning as commonly understood by one of ordinary skill in the art. It will be further understood that terms such as those defined in commonly-used dictionaries, should be interpreted as having a meaning that is consistent with their meaning in the context of the relevant art and will not be interpreted in an idealized or overly formal sense unless expressly so defined herein.

Hereinafter, exemplary embodiments will be described more fully with reference to the accompanying drawings. Widths and thicknesses of layers or regions in the drawings may be exaggerated for clarity. Like reference numerals in the drawings refer to like elements throughout.

Figure 1:
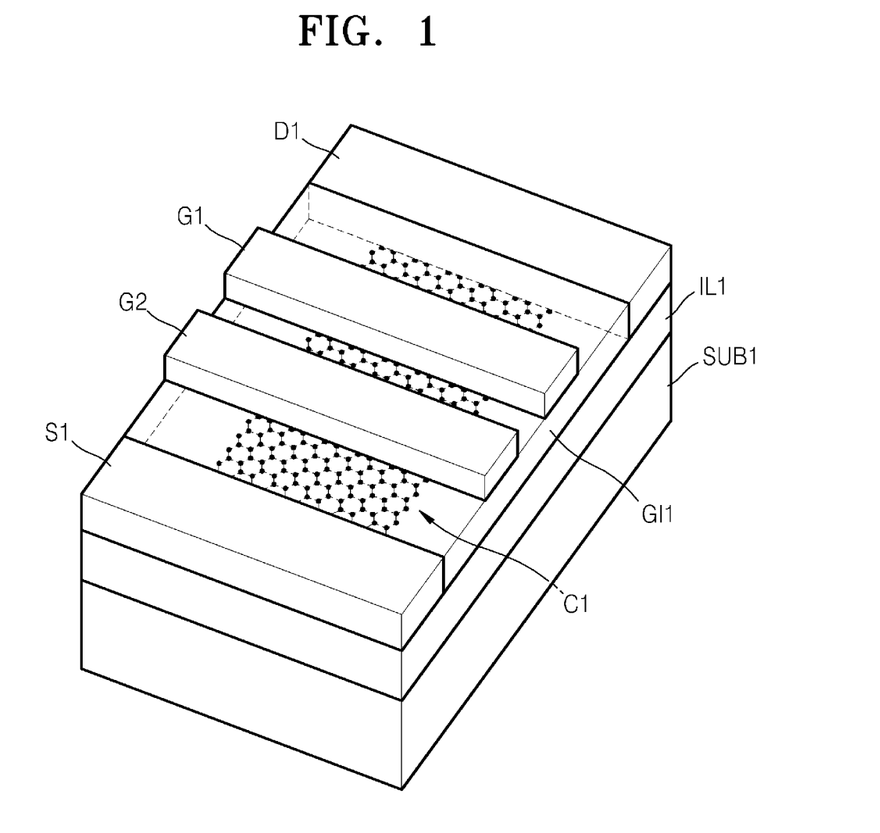
FIG. 1 is a perspective view of a transistor according to an exemplary embodiment.

FIG. 1 is a perspective view of a transistor according to an exemplary embodiment.

Referring to FIG. 1, a channel layer C1 may be disposed on a substrate SUB1. The substrate SUB1 may be a semiconductor substrate, such as a silicon substrate, or other substrates, for example, one among various substrates that are used in a process of manufacturing an electronic device, such as a glass substrate or a plastic substrate. When the substrate SUB1 is a semiconductor substrate or a conductive substrate, after forming an insulating layer IL1 on the substrate SUB1, the channel layer C1 may be formed on the insulating layer IL1. The insulating layer IL1 may be a silicon oxide layer, but the material of the insulating layer IL1 is not limited thereto. Various materials may be used in forming the insulating layer IL1.

The channel layer C1 may be formed of an ambipolar material having both of N-type semiconductor characteristic and P-type semiconductor characteristic. The ambipolar material may be a carbon-based material, for example. In detail, the ambipolar material may be graphene. Graphene is a single layer structure including a unit structure in which six carbon atoms constitute hexagon. When the channel layer C1 is formed of graphene, for example, the channel layer C1 may include about 1 to 10 graphene sheets. In other words, the channel layer C1 may be a single graphene or may have a structure in which about 10 or less graphenes are stacked. Ambipolar characteristics of the channel layer C1 will be described later in more detail.

A source electrode S1 and a drain electrode D1 may be disposed to contact both ends of the channel layer C1, respectively. A gate insulating layer GI1 may be disposed on the insulating layer IL1 between the source electrode S1 and the drain electrode D1 so as to cover the channel layer C1. The gate insulating layer GI1 may include a silicon oxide, a silicon oxynitride, or a silicon nitride, or other materials, for example, a high-k material having a higher dielectric constant than that of the silicon nitride. The gate insulating layer GI1 may be a single layer structure or a multi-layer structure. A plurality of gates G1 and G2 may be disposed on the gate insulating layer G11. The plurality of gates G1 and G2 may be spaced apart from each other in a horizontal direction. The plurality of gates G1 and G2 may be disposed on a surface (e.g., a top surface) of the channel layer C1, and the gate insulating layer GI1 may be disposed between the channel layer C1 and the plurality of gates G1 and G2.

The plurality of gates G1 and G2 may include a first gate G1 and a second gate G2. The first gate G1 may switch (or determine) a type of the transistor. The type of the transistor may be switched between an N-type and a P-type by the first gate G1. Thus, the transistor according to the current embodiment may be a type-switching transistor. The second gate G2 may control ON/OFF characteristics of the first channel layer C1. Since the ON/OFF characteristics of the channel layer C1 may correspond to ON/OFF characteristics of the transistor, the second gate G2 may control ON/OFF characteristics of the transistor. Functions/roles of the first and second gates G1 and G2 will be described later in more detail. Meanwhile, a distance between the first and second gates G1 and G2 may be several tens of nm or less. The distance between the first and second gates G1 and G2 may be reduced up to a distance at which the first and second gates G1 and G2 are electrically insulated from each other, for example, up to approximately 1 nm.

In addition, although FIG. 1 illustrates that the channel layer C1 includes graphene having a sheet structure, graphene that is used in forming the channel layer C1 may be patterned in a predetermined shape. For example, the channel layer C1 may include graphene having a nanomesh or a nanoribbon structure. As graphene is patterned in a nanomesh or a nanoribbon shape, electrical characteristics of grephene may be varied.

Figure 2:
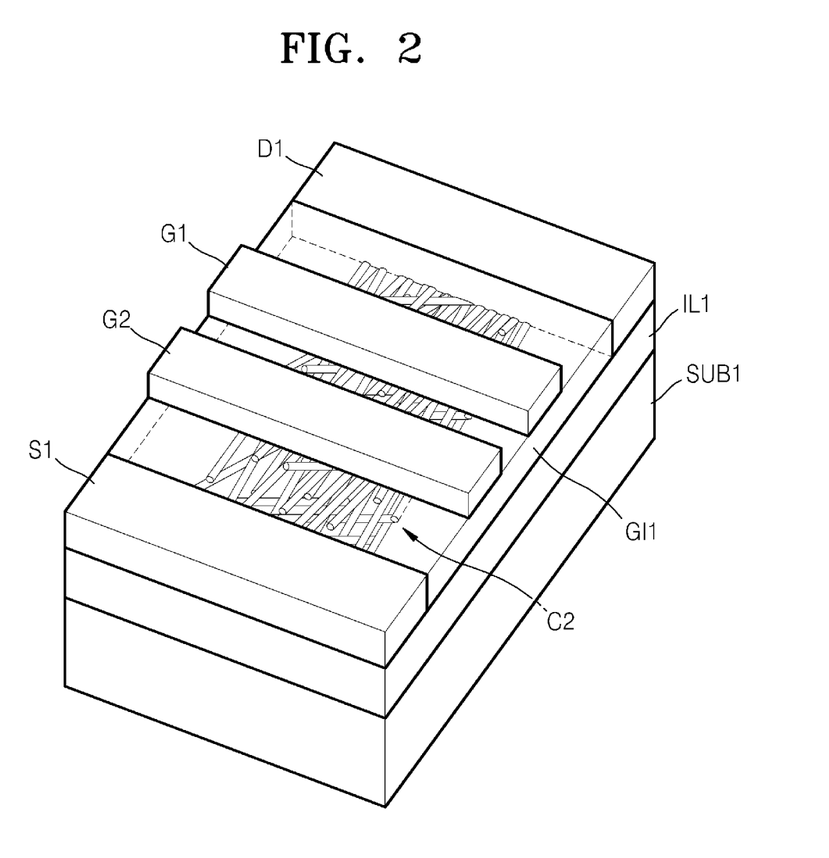
FIG. 2 is a perspective view of a transistor according to another exemplary embodiment.

In addition, although the channel layer C1 of FIG. 1 includes graphene, the material of the channel layer C1 may be varied. For example, as illustrated in FIG. 2, a channel layer C2 may include a carbon nanotube (CNT). In this case, the channel layer C2 may have a network structure in which a plurality of CNTs are tangled. The channel layer C2 may have ambipolar characteristics. The remaining structures of the transistor of FIG. 2, except for the channel layer C2, may be the same as those of FIG. 1.

According to another embodiment, the channel layer C2 illustrated in FIG. 2 may be constituted of an individual CNT. That is, the channel layer C2 may be constituted of a single piece of CNT. In addition, as illustrated in FIG. 2, when the channel layer C2 includes a plurality of CNTs, the channel layer C2 may be patterned in a predetermined shape.

Although FIG. 1 illustrates that the channel layer C1 includes graphene and FIG. 2 illustrates that the channel layer C2 includes CNTs, the other embodiments are not limited thereto, and various materials may be used in forming the channel layers C1 and C2. Any materials having ambipolar characteristic may be applied to form the channel layers C1 and C2.

Figure 3A:
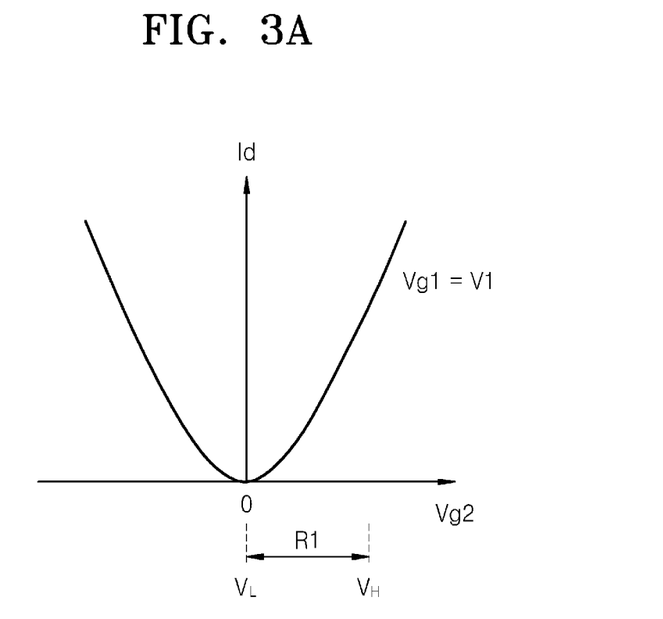
FIGS. 3A and 3B are graphs showing a variation of a second gate voltage (Vg2)-drain current (Id) of a transistor, an example of which is illustrated in FIG. 1, with respect to a first gate voltage (Vg1) that is applied to a first gate of the transistor.
Figure 3B:
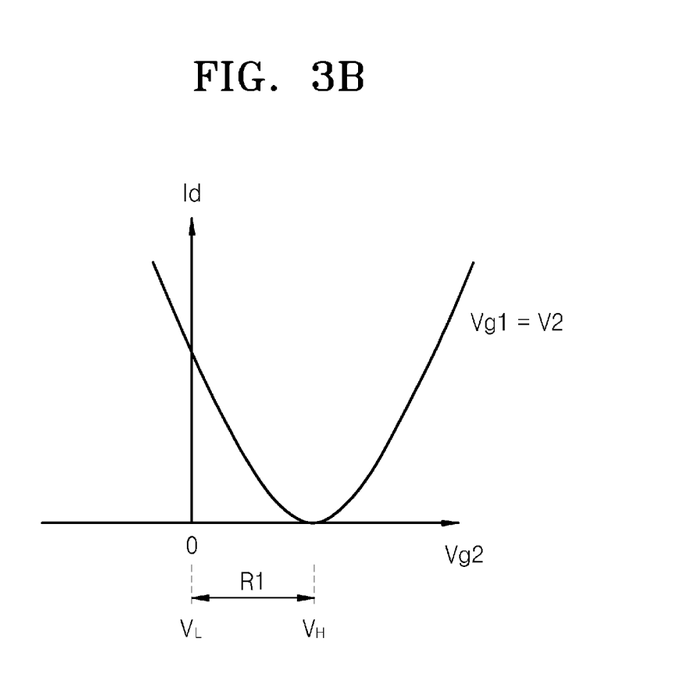

Hereinafter, the ambipolar characteristic of the channel layer C1 and roles of the first and second gates G1 and G2 illustrated in FIG. 1 will be described in detail with reference to FIGS. 3A and 3B. FIGS. 3A and 3B will be described by referring to the structure of FIG. 1, by way of example. The following description of FIGS. 3A and 3B includes a method of operating a transistor, according to an exemplary embodiment.

FIG. 3A is a graph showing a variation of a drain current Id according to a voltage Vg2 applied to the second gate G2

(hereinafter, referred to as a second gate voltage), when a first voltage V1 is applied to the first gate G1 of the transistor illustrated in FIG. 1 (i.e., when a first gate voltage Vg1 is the first voltage V1). The drain current Id represents the current that flows between the source electrode S1 and the drain electrode D1.

Referring to FIG. 3A, an inclination of the drain current Id according to an increase in the second gate voltage Vg2 is changed at a predetermined reference point (here, 0 volts (V)). That is, the drain current Id decreases when the second gate voltage Vg2 increases from a negative value to approximately 0 V, and the drain current Id increases when the second gate voltage Vg2 increases from approximately 0 V to a positive value. Characteristics of the P-type transistor are that the drain current Id decreases as the second gate voltage Vg2 increases, and characteristics of the N-type transistor are that the drain current Id increases as the second gate voltage Vg2 increases. As such, the transistor illustrated in FIG. 1 may have both the characteristics of the P-type transistor and the N-type transistor, depending on operation conditions.

Reference numeral R1 in FIG. 3A represents a range of an operation voltage that may be actually used (i.e., a range of a normal operation voltage). Hereinafter, the range R1 is referred to as an operation voltage range R1. The operation voltage range R1 may be approximately 0 V to several voltages, for example. As such, when the operation voltage range R1 is more than 0 V, the transistor illustrated in FIG. 1 may be used as an N-type transistor. In this case, when a voltage at a high level in the operation voltage range R1 (i.e., a high-level voltage $V_H$ is applied to the second gate G2), the channel layer C1 may go into an ON state. In other words, a substantial operation current may flow between the source electrode S1 and the drain electrode D1 via the channel layer C1. When a voltage at a low level in the operation voltage range R1, i.e., a low-level voltage $V_L$ is applied to the second gate G2, the channel layer C1 may go into an OFF state. That is, the flow of the current between the source electrode S1 and the drain electrode D1 via the channel layer C1 is cut off. When the transistor, an example of which is illustrated in FIG. 1, is operated using the second gate G2, a predetermined voltage may be applied to the second gate G2 and simultaneously, a voltage may be applied between the source electrode S1 and the drain electrode D1. In other words, the transistor, an example of which is illustrated in FIG. 1, may be driven by applying a predetermined voltage to the second gate G2, the source electrode S1 and the drain electrode D1.

FIG. 3B is a graph showing a variation of the drain current Id according to the second gate voltage Vg2, when a second voltage V2 is applied to the first gate G1 of the transistor illustrated in FIG. 1 (i.e., when the first gate voltage Vg1 is the second voltage V2). The second voltage V2 may be different from the first voltage V1 illustrated in FIG. 3A. For example, the second voltage V2 may be lower than the first voltage V1. In other words, the first voltage V1 may be a predetermined high voltage, and the second voltage V2 may be a predetermined low voltage.

Referring to FIG. 3B, the graph of FIG. 3B is considerably shifted to the right side compared to the graph of FIG. 3A. In this case, the transistor illustrated in FIG. 1 may be used as a P-type transistor in the operation voltage range R1. In FIG. 3A illustrating the first voltage V1 applied to the first gate G1, the transistor is used as an N-type transistor in the operation voltage range R1, and in FIG. 3B illustrating the second voltage V2 applied to the first gate G1, the transistor may be used as a P-type transistor in the operation voltage range R1. As such, the type of the transistor illustrated in FIG. 1 in the operation voltage range R1 may be varied according to a voltage applied to the first gate G1.

As illustrated in FIG. 3B, when the transistor is used as a P-type transistor in the operation voltage range R1, if a voltage at a high level (i.e., a high-level voltage $V_H$ is applied to the second gate G2), the channel layer C1 may go into an OFF state. When a voltage at a low level, i.e., a low-level voltage $V_L$ is applied to the second gate G2, the channel layer C1 may go into an ON state. This case is opposite to the case of FIG. 3A.

As described above, the first voltage V1 that is applied to the first gate G1 in FIG. 3A, may be relatively larger than the second voltage V2 applied to the first gate G1 in FIG. 3B. In other words, the transfer graph may be moved to a negative direction when the relatively large first voltage V1 is applied to the first gate G1 (FIG. 3A) compared a case where the relatively small second voltage V2 is applied to the first gate G1 (FIG. 3B). The first voltage V1 may be about several voltages, for example, and the second voltage V2 may be lower than the first voltage V1, for example, up to 0 V. However, an aspect of an exemplary embodiment is not limited thereto, and the magnitudes of the first and second voltages V1 and V2 may be varied according to the material, size, or the like of the transistor illustrated in FIG. 1. In addition, a moving direction of the graph according to a variation of the voltage applied to the first gate G1 may be varied.

FIGS. 3A and 3B may be summarized as shown in the following Table 1.

TABLE 1

| Vg1 | Transistor type | Vg2 | Channel |
|---|---|---|---|
| V1 (ex. High) | N-type | High ($V_H$) | ON |
|  |  | Low ($V_L$) | OFF |
| V2 (ex. Low) | P-type | High ($V_H$) | OFF |
|  |  | Low ($V_L$) | ON |

As shown in Table 1, when the first voltage V1 is applied to the first gate G1, the transistor may be switched to be an N-type transistor, and when the second voltage V2 is applied to the first gate G1, the transistor may be switched to be a P-type transistor. When the transistor is an N-type transistor, if the high-level voltage $V_H$ is applied to the second gate G2, the channel layer C1 may go into an ON state, and if the low-level voltage $V_L$ is applied to the second gate G2, the channel layer C1 may go into an OFF state. When the transistor is a P-type transistor, if the high-level voltage $V_H$ is applied to the second gate G2, the channel layer C1 may go into an OFF state, and if the low-level voltage $V_L$ is applied to the second gate G2, the channel layer C1 may go into an ON state.

As illustrated in FIG. 1, when the first and second gates G1 and G2 are formed above the channel layer C1, coupling characteristics between the channel layer C1 and the first and second gates G1 and G2 may be easily obtained (i.e., improved). Also, a process of forming the first and second gates G1 and G2 may be easy when the first and second gates G1 and G2 are formed above the channel layer C1. If a bottom gate is formed within the substrate SUB1 instead of forming the first and second gates G1 and G2 above the channel layer C1, coupling characteristics between the bottom gate and the channel layer C1 may be deteriorated. Also, since it is difficult to form a plurality of separated gates (e.g., bottom gates) within the substrate SUB1, it is not easy to form a plurality of bottom gates corresponding to one channel layer C1; and separating control for each of a plurality of devices may be difficult when a large-scale integrated device is manufactured. In this regard, when the first and second gates G1 and G2 are formed above the channel layer C1, the characteristics of the transistor may be easily improved, and the manufacturing process thereof may be easier compared to a case where a plurality of bottom gates are formed within the substrate SUB1.

In the exemplary embodiment shown in FIG. 1, if the first and second gates G1 and G2 are separately disposed above and below the channel layer C1, electric fields that are generated from the first and second gates G1 and G2 may interfere with each other. That is, when the first and second gates G1 and G2 are disposed above and below the channel layer C1 in symmetrical positions, directions in which electric fields are applied to the channel layer C1 from the first and second gates G1 and G2 are opposite to each other so that two electric fields may be offset relative to one another. In particular, when the two gates G1 and G2 are disposed above and below the channel layer C1 and are in the same vertical line, electric fields that are generated from the first and second gates G1 and G2 may interfere with each other (i.e., be offset relative to one another). In this regard, desired characteristics/effects of an exemplary embodiment may be easily obtained when the first and second gates G1 and G2 are formed on a surface (e.g., the top surface in FIG. 1) of the channel layer C1, and spaced apart from each other in a horizontal direction, as illustrated in FIG. 1. However, although the first and second gates G1 and G2 are disposed above and below the channel layer C1, when the first and second gates G1 and G2 are not symmetrical with each other with respect to the channel layer C1, electric fields that are applied to the channel layer C1 from the first and second gates G1 and G2 may be not offset relative to one another so that desired characteristics/effects of an exemplary embodiment may be obtained. In other words, although the first and second gates G1 and G2 are disposed above and below the channel layer C1, when electric fields that are generated from the first and second gates G1 and G2 do not interfere with (i.e., are not offset relative to one another), the above-described structure may be adopted. For example, when the first and second gates G1 and G2 are disposed above and below the channel layer C1 and at least one of the first and second gates G1 and G2 does not overlap the channel layer C1 and a line (straight line) for connecting portions of the first and second gates G1 and G2, for example, center portions of the first and second gates G1 and G2, does not pass through the channel layer C1, electric fields that are generated from the first and second gates G1 and G2 may not be offset relative to one another within the channel layer C1. This will be described later in more detail with reference to FIGS. 8 through 10.

The transistors according to exemplary embodiments may be used in various electronic devices for several purposes. For example, the transistor according to an exemplary embodiment may be applied to a logic device, such as an inverter.

Figure 4:
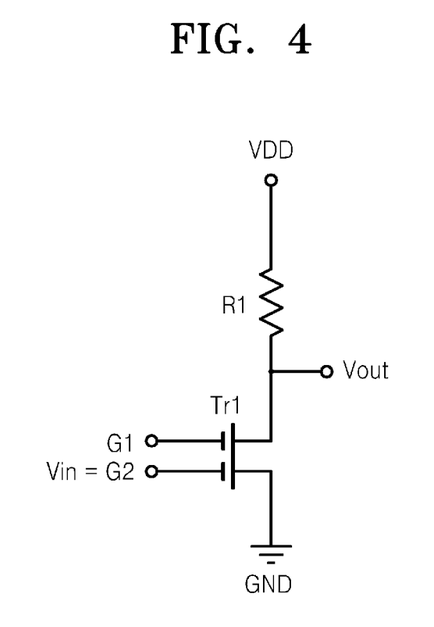
FIG. 4 is a circuit diagram of an electronic device (logic device) including a transistor, according to an exemplary embodiment.

FIG. 4 is a circuit diagram of an electronic device (e.g., a logic device) including a transistor, according to an exemplary embodiment. The electronic device (logic device) illustrated in FIG. 4 may be a resistor load type device (e.g., an inverter).

Referring to FIG. 4, one transistor Tr1 may be connected to one resistor R1. A power supply terminal VDD may be connected to one end of the resistor R1, and the transistor Tr1 may be connected to the other end of the resistor R1. The transistor Tr1 may be a type-switching transistor according to an exemplary embodiment. That is, the transistor Tr1 may have the structure illustrated in FIG. 1 or 2 or a modified structure therefrom. The resistor R1 may be connected to a drain electrode of the transistor Tr1. A source electrode of the transistor Tr1 may be connected to a ground terminal GND. The transistor Tr1 may include a plurality of gates, for example, a first gate G1 and a second gate G2. Each of the first and second gates G1 and G2 may correspond to each of the first and second gates G1 and G2 illustrated in FIGS. 1 and 2. The first gate G1 may be used for switching the type of the transistor Tr1, and the second gate G1 may be used for controlling ON/OFF characteristics of the transistor Tr1 (i.e., gating the transistor Tr1). An input terminal Vin may be connected to the second gate G2. An output terminal Vout may be connected between the transistor Tr1 and the resistor R1. That is, the output terminal Vout may be commonly connected to the drain electrode of the transistor Tr1 and an end (e.g., the other end) of the resistor R1.

A method of operating the electronic device (logic device) illustrated in FIG. 4 will now be described as below. The method is associated with the method of operating the transistor illustrated in FIGS. 3A and 3B.

The transistor Tr1 may operate as a first type transistor, for example, an N-type transistor, by applying a first voltage V1 to the first gate G1 of the transistor Tr1 illustrated in FIG. 4. In this case, when a high-level voltage $V_H$ is applied to the second gate G2 via the input terminal Vin, a channel layer of the transistor Tr1 is turned on so that current may flow through the transistor Tr1. This means that a resistance of the transistor Tr1 may be greatly reduced. In this case, the resistance of the transistor Tr1 may be much lower than a resistance of the resistor R1. Thus, a low-level voltage $V_L$ that corresponds to the ground terminal GND may be applied to the output terminal Vout. That is, a signal that corresponds to the low-level voltage $V_L$ may be output from the output terminal Vout. When a low-level voltage $V_L$ is applied to the second gate G2 via the input terminal Vin, the channel layer of the transistor Tr1 is turned off so that the resistance of the transistor Tr1 may be greatly increased. In this case, the resistance of the transistor Tr1 may be much higher than the resistance of the resistor R1. Thus, the high-level voltage $V_H$ that corresponds to the power supply terminal VDD may be applied to the output terminal Vout. That is, a signal that corresponds to the high-level voltage $V_H$ may be output from the output terminal Vout.

The transistor Tr1 may operate as a second type transistor, for example, a P-type transistor, by applying a second voltage V2 to the first gate G1 of the transistor Tr1 illustrated in FIG. 4. In this case, when the high-level voltage $V_H$ is applied to the second gate G2 via the input terminal Vin, the channel layer of the transistor Tr1 is turned off so that the resistance of the transistor Tr1 may be greatly increased. Thus, the high-level voltage $V_H$ that corresponds to the power supply terminal VDD may be applied to the output terminal Vout. That is, a signal that corresponds to the high-level voltage $V_H$ may be output from the output terminal Vout. When the low-level voltage $V_L$ is applied to the second gate G2 via the input terminal Vin, the channel layer of the transistor Tr1 is turned on so that the resistance of the transistor Tr1 may be greatly reduced. Thus, the low-level voltage $V_L$ that corresponds to the ground terminal GND may be applied to the output terminal Vout. That is, a signal that corresponds to the low-level voltage $V_L$ may be output from the output terminal Vout.

In this way, an output signal with respect to an input signal may be inverted or not inverted depending on whether the transistor Tr1 is operated as an N-type transistor or a P-type transistor. When the transistor Tr1 is operated as an N-type transistor, if the high-level voltage $V_H$ is input to the input terminal Vin, the low-level voltage $V_L$ may be output from the output terminal Vout. When the transistor Tr1 is operated as a P-type transistor, if the high-level voltage $V_H$ is input to the input terminal Vin, the high-level voltage $V_H$ may be output from the output terminal Vout. In other words, when the transistor Tr1 is operated as an N-type transistor, the electronic device illustrated in FIG. 4 may output logic '0' in response to inputting of logic '1', and when the transistor Tr1 is operated as a P-type transistor, the electronic device of FIG. 4 may output logic '1' in response to inputting of logic '1'. The electronic device of FIG. 4 may be a multifunctional device having various functions in one device. In addition, the electronic device of FIG. 4 may be regarded as a reconfigurable device.

The method of operating the electronic device (e.g., logic device) illustrated in FIG. 4 may be defined, as shown in the following Table 2. Table 2 includes the description of Table 1.

TABLE 2

| Vg1 | Transistor type | Vg2 (Vin) | Channel | Vout | Inverting |
|---|---|---|---|---|---|
| V1 (ex. High) | N-type | High ($V_H$) Low ($V_L$) | ON OFF | Low High | Yes |
| V2 (ex. Low) | P-type | High ($V_H$) Low ($V_L$) | OFF ON | High Low | No |

As shown in Table 2, when the first voltage V1 is applied to the first gate G1 and the transistor Tr1 is operated as an N-type transistor, inverting characteristic of the transistor Tr1 that an output signal is inverted with respect to an input signal may occur. On the other hand, when the second voltage V2 is applied to the second gate G2 and the transistor Tr1 is operated as a P-type transistor, a signal that is the same as the input signal may be output from the transistor Tr1.

Figure 5:
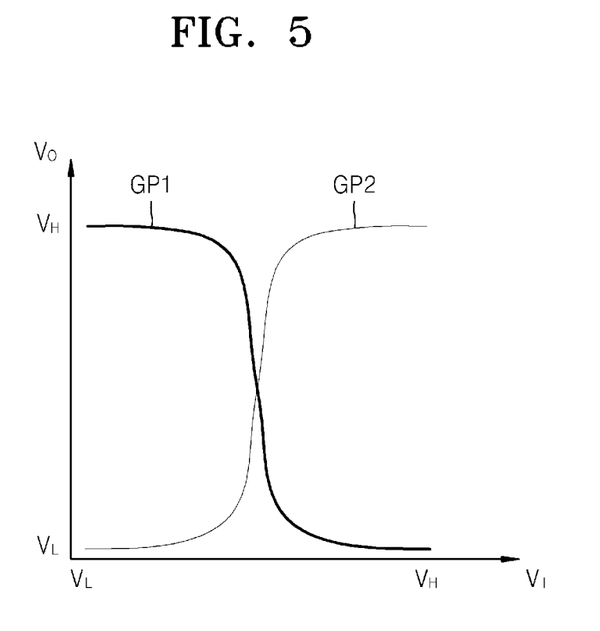
FIG. 5 is a graph showing a voltage transfer characteristic (VTC) of an electronic device (logic device), an example of which is illustrated in FIG. 4.

FIG. 5 is a graph showing a voltage transfer characteristic (VTC) of the electronic device (logic device) illustrated in FIG. 4. In other words, FIG. 5 is a graph showing characteristics of an input voltage $V_I$ versus an output voltage $V_O$ of the electronic device (logic device) illustrated in FIG. 4. A first graph GP1 of FIG. 5 corresponds to a case where the transistor Tr1 is an N-type transistor, and a second graph GP2 of FIG. 5 corresponds to a case where the transistor Tr1 is a P-type transistor. The first graph GP1 may refer to a case where the electronic device (logic device) is operated in a first mode, and the second graph GP2 may refer to a case where the electronic device (logic device) is operated in a second mode.

Referring to FIG. 5, in the first graph GP1, when a low-level voltage $V_L$ is input to the device, a high-level voltage $V_H$ is output from the device, and when the high-level voltage $V_H$ is input to the device, the low-level voltage $V_L$ is output from the device. On the other hand, in the second graph GP2, when the low-level voltage $V_L$ is input to the device, the low-level voltage $V_L$ is output from the device, and when the high-level voltage $V_H$ is input to the device, the high-level voltage $V_H$ is output from the device. The result of the first graph GP1 is directed to a case where the transistor Tr1 is an N-type transistor, as shown in Table 2, and the result of the second graph GP2 is directed to a case where the transistor Tr1 is a P-type transistor, as shown in Table 2.

Figure 6A:
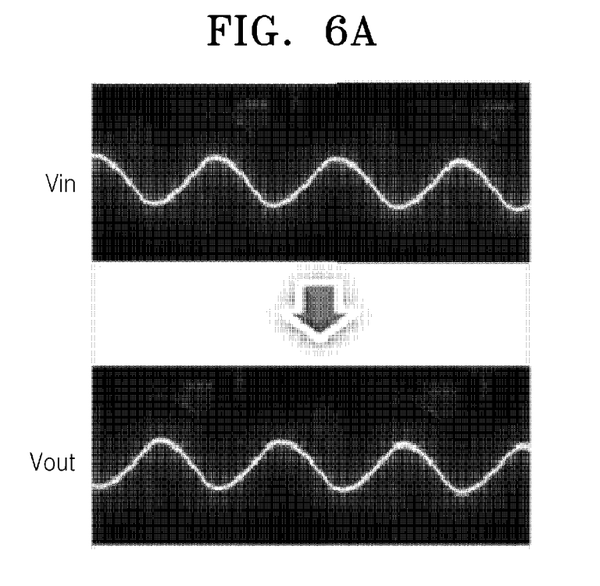
FIG. 6A is a graph showing waveforms of an input signal and an output signal when an electronic device, an example of which is illustrated in FIG. 4, is operated in a first mode.

FIG. 6A is a graph showing waveforms of an input signal Vin and an output signal Vout when the electronic device (logic device) illustrated in FIG. 4 is operated in a first mode. Referring to FIG. 6A, when the electronic device (logic device) is operated in the first mode, the waveform of the output signal Vout with respect to the input signal Vin is inverted. This corresponds to a case where a first gate voltage Vg1 is the first voltage V1, i.e., a case where the transistor Tr1 is an N-type transistor, as shown in Table 2.

Figure 6B:
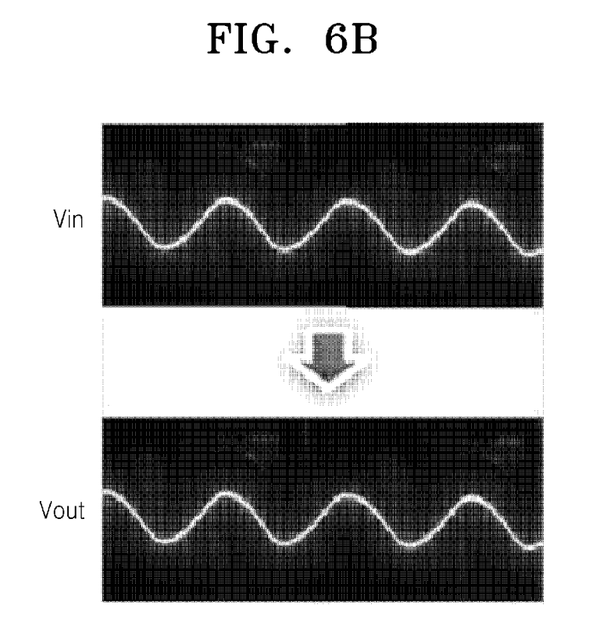
FIG. 6B is a graph showing waveforms of an input signal and an output signal when an electronic device, an example of which is illustrated in FIG. 4, is operated in a second mode.

FIG. 6B is a graph showing waveforms of an input signal Vin and an output signal Vout when the electronic device (logic device) illustrated in FIG. 4 is operated in a second mode. Referring to FIG. 6B, when the electronic device (logic device) is operated in the second mode, the waveforms of the input signal Vin and the output signal Vout are the same. This corresponds to a case where a first gate voltage Vg1 is the second voltage V2, i.e., a case where the transistor Tr1 is a P-type transistor, as shown in Table 2.

Accordingly, the electronic device illustrated in FIG. 4 is a multifunctional device having various functions according to operation modes and a reconfigurable device. Thus, when a predetermined electronic circuit is configured by using the electronic device illustrated in FIG. 4, the degree of integration of the electronic circuit may be improved, and miniaturization of the electronic circuit may be implemented.

The transistors illustrated in FIGS. 1 and 2 may be modified in various ways. For example, according to another exemplary embodiment, the plurality of gates G1 and G2 may be disposed below the channel layer C1. An example thereof is shown in FIG. 7.

Figure 7:
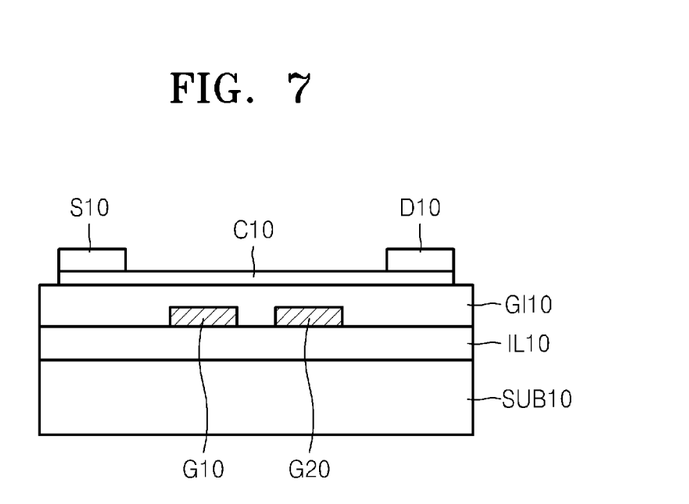
FIG. 7 is a cross-sectional view of a transistor according to another exemplary embodiment.

FIG. 7 is a cross-sectional view of a transistor according to another exemplary embodiment. Referring to FIG. 7, an insulating layer IL10 may be disposed on a substrate SUB10, and a plurality of gates G10 and G20 may be disposed on the insulating layer IL10. The insulating layer IL10 may not be provided according to the type of the substrate SUB10. In other words, the plurality of gates G10 and G20 may be disposed directly on the substrate SUB10 without the insulating layer IL10. The plurality of gates G10 and G20 may include first and second gates G10 and G20, for example. A gate insulating layer GI10 may be disposed on the insulating layer IL10 so as to cover the first and second gates G10 and G20. A channel layer C10 may be disposed on the gate insulating layer GI10. The channel layer C10 may extend to both sides of the plurality of gates G10 and G20. Thus, the plurality of gates G10 and G20 may be disposed below the channel layer C10. The channel layer C10 may be formed of the same material as or a similar material to that of the channel layer C1 illustrated in FIG. 1. That is, the channel layer C10 may include an ambipolar material. The ambipolar material may be a carbon-based material, such as graphene or CNT. A source electrode S10 and a drain electrode D10 may be disposed to contact both ends of the channel layer C1. The plurality of gates G10 and G20 may be disposed between the source electrode S10 and the drain electrode D10, when viewed from above. The first gate G10 may be used for switching (or determining) the type of a transistor. The second gate G20 may be used for controlling ON/OFF characteristics of the channel layer C10, i.e., ON/OFF characteristics of the transistor.

Figure 8:
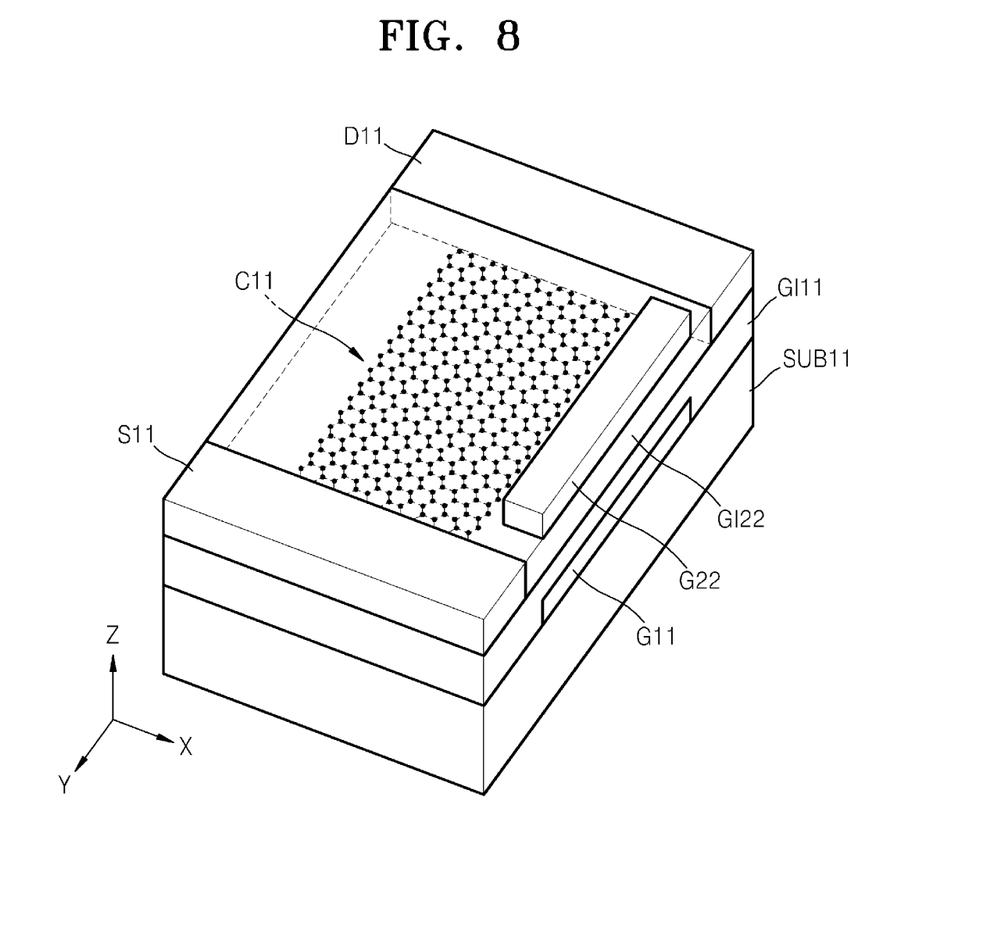
FIG. 8 is a perspective view of a transistor according to another exemplary embodiment.

FIG. 8 is a perspective view of a transistor according to another exemplary embodiment. The current embodiment refers to a case where first and second gates G11 and G22 are disposed above and below a channel layer C11.

Referring to FIG. 8, the first gate G11 may be disposed in a position lower than the channel layer C11, and the second gate G22 may be disposed in a position higher than the channel layer C11. That is, the first and second gates G11 and G22 may be disposed above and below the channel layer C11. A first gate insulating layer GI111 may be formed between the first gate G11 and the channel layer C11, and a second gate insulating layer GI122 may be formed between the second gate G22 and the channel layer C11. When viewed from above, at least one of the first gate G11 and the second gate G22 may not overlap the channel layer C11. For example, both the first gate G11 and the second gate G22 may not overlap the channel layer C11. A line (straight line) that connects a portion (for example, a center) of the first gate G11 and a portion (for example, a center) of the second gate G22 may not pass through the channel layer C11. In this case, the first and second gates G11 and G22 may be slightly deviated from the channel layer C11 in a lateral direction of the channel layer C11. The channel layer C11 may not be disposed between the first and second gates G11 and G22. In this way, when the first and second gates G11 and G22 are slightly deviated from the channel layer C11 in a lateral direction of the channel layer C11 between the source electrode S11 and the drain electrode D11, a first electric field that is applied to the channel layer C11 from the first gate G11 and a second electric field that is applied to the channel layer C11 from the second gate G22 may not be offset relative to one another. Reference numeral SUB11 in FIG. 8 represents a substrate.

Figure 9:
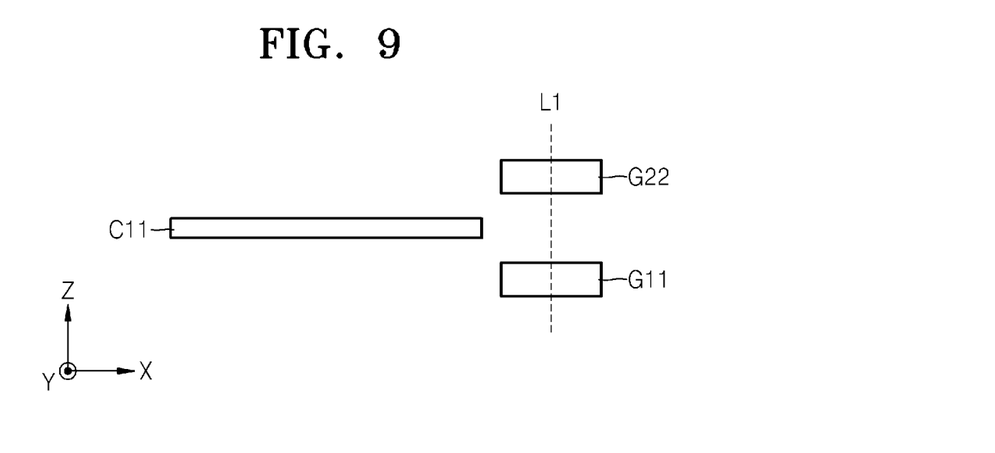
FIG. 9 is a cross-sectional view for explaining the relationship between a position of a channel layer and positions of two gates of a transistor, an example of which is illustrated in FIG. 8.

FIG. 9 is a cross-sectional view for explaining the relationship between a position of the channel layer C11 and positions of the first and second gates G11 and G22 of the transistor, an example of which is illustrated in FIG. 8. For convenience of explanation, FIG. 9 illustrates only the channel layer C11 and the first and second gates G11 and G22.

Referring to FIG. 9, the first and second gates G11 and G22 may be disposed above and below the channel layer C11 and may be deviated from the channel layer C11 in a lateral direction of the channel layer C11. Centers of the first and second gates G11 and G22 may be disposed in the same vertical line L1. Thus, the channel layer C11 may not be disposed between the first and second gates G11 and G22. In addition, a line (straight line) that connects a portion (for example, a center) of the first gate G11 and a portion (for example, a center) of the second gate G22 may not pass through the channel layer C11.

Although, in FIG. 9, the centers of the first and second gates G11 and G22 are disposed in the same vertical line L1, the present invention is not limited thereto. In other cases, the centers of the first and second gates G11 and G22 may not be disposed in the same vertical line L1. In addition, one of the first and second gates G11 and G22 may overlap the channel layer C11. For example, the structure of FIG. 9 may be modified, as illustrated in FIG. 10.

Figure 10:
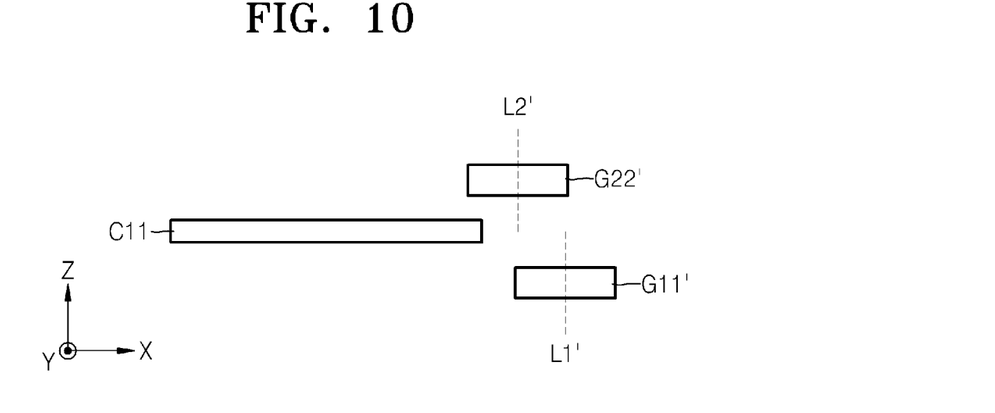
FIG. 10 is a cross-sectional view for explaining a modified example of FIG. 9.

Referring to FIG. 10, centers of first and second gates G11' and G22' may not be disposed in the same vertical line. That is, a first vertical line L1' that passes through the center of the first gate G11' and a second vertical line L2' that passes through the center of the second gate G22' may not be the same. In addition, one of the first and second gates G11' and G22', for example, the second gate G22' may overlap the channel layer C11. However, even in this case, a line (i.e., a straight line) that connects a portion (for example, the center) of the first gate G11' and a portion (for example, the center) of the second gate G22' may not pass through the channel layer C11. Thus, a first electric field that is applied to the channel layer C11 from the first gate G11' and a second electric field that is applied to the channel layer C11 from the second gate G22' may not be offset relative to one another.

Figure 11:
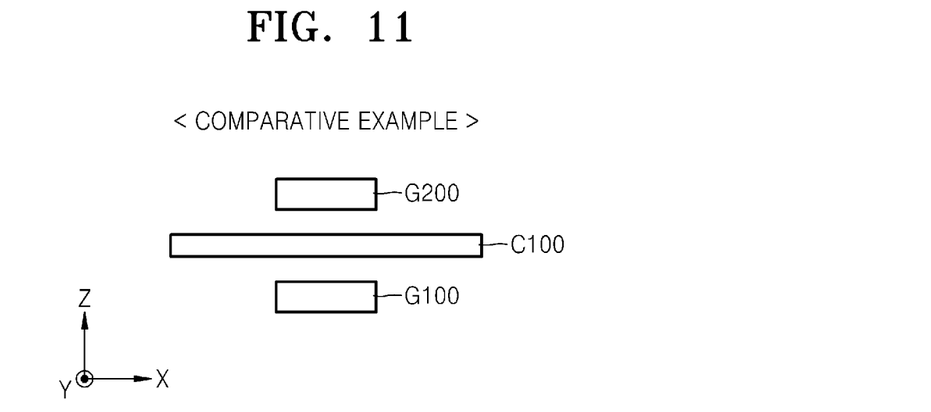
FIG. 11 is a cross-sectional view for explaining the relationship between a position of a channel layer and positions of two gates of a transistor according to a comparative example.

FIG. 11 is a cross-sectional view for explaining the relationship between a position of a channel layer C100 and positions of first and second gates G100 and G200 of a transistor according to a comparative example.

Referring to FIG. 11, the first and second gates G100 and G200 are symmetrical with each other in a vertical direction with respect to the channel layer C100. That is, the first and second gates G100 and G200 are disposed above and below the channel layer C100, and a line that connects centers of the first and second gates G100 and G200 passes through the channel layer C100. In this case, since a direction of a first electric field (not shown) that is applied to the channel layer C100 from the first gate G100 and a direction of a second electric field (not shown) that is applied to the channel layer C100 from the second gate G200 are opposite to each other, the first electric field and the second electric field may be offset relative to one another. Thus, the transistor including the structure illustrated in FIG. 11 may not be appropriate for obtaining desired characteristics/effects.

However, even when two gates are disposed above and below a channel layer, as illustrated in FIGS. 8 through 10, a structure in which electric fields that are generated from two gates are not offset relative to one another within the channel layer, may be appropriate for obtaining desired characteristics/effects. Thus, like the transistors illustrated in FIGS. 1, 2, and 7, the transistors having the structures illustrated in FIGS. 8 through 10 may be type-switching transistors and may be applied to the electronic device (logic device) illustrated in FIG. 4.

Transistors according to the one or more exemplary embodiments may be used as devices for switching, driving, or amplification and may be applied to various memory devices (volatile or nonvolatile) including static random access memory (SRAMs) as well as inverters. For example, when the transistors are applied to SRAMs, the SRAMs may include a circuit in which two logic devices of FIG. 4 face each other and are connected to each other. In addition, the transistors according to the one or more exemplary embodiments may be applied to various electronic devices for various purposes.

While aspects of exemplary embodiments have been particularly shown and described, it should be understood that these exemplary embodiments should be considered in a descriptive sense only and not for purposes of limitation. Descriptions of features or aspects within each exemplary embodiment should typically be considered as available for other similar features or aspects in other exemplary embodiments. It would be appreciated by those of ordinary skill in the art that changes may be made in the structures of the transistors shown in FIGS. 1, 2, and 7. For example, the transistor may include three or more gates. In addition, the idea of the exemplary embodiments may be applied to devices other than transistors without departing from the principles and spirit of the inventive concept.

What is claimed is:

1. A type-switching transistor comprising:
    a channel layer;
    a source electrode that contacts a first region of the channel layer;
    a drain electrode that contacts a second region of the channel layer; and
    a plurality of gates comprising: a first gate configured to switch a type of the transistor, and a second gate configured to control characteristics of the channel layer,
    wherein the first and second gates are disposed on a surface of the channel layer, and
    wherein at least one of the first and second gates does not overlap the channel layer and the channel layer does not overlap the at least one of the first and second gates.

2. The type-switching transistor of claim 1, wherein the channel layer comprises an ambipolar material.

3. The type-switching transistor of claim 1, wherein the channel layer comprises a carbon nanotube (CNT).

4. The type-switching transistor of claim 1, wherein the channel layer comprises graphene.

5. The type-switching transistor of claim 1, wherein, when a first voltage is applied to the first gate, the transistor is configured to operate as an N-type transistor, and when a second voltage that is different from the first voltage is applied to the first gate, the transistor is configured to operate as a P-type transistor.

6. The type-switching transistor of claim 1, wherein, when the transistor is configured as an N-type transistor, if a third voltage is applied to the second gate, the channel layer is in an OFF state, and if a fourth voltage that is greater than the third voltage is applied to the second gate, the channel layer is in an ON state.

7. The type-switching transistor of claim 1, wherein, when the transistor is configured as a P-type transistor, if a fifth voltage is applied to the second gate, the channel layer is in an OFF state, and if a sixth voltage that is smaller than the fifth voltage is applied to the second gate, the channel layer is in an ON state.

8. The type-switching transistor of claim 1, wherein the plurality of gates are disposed on a same side of the channel layer.

9. The type-switching transistor of claim 8, wherein the plurality of gates are disposed above the channel layer.

10. The type-switching transistor of claim 8, wherein the plurality of gates are disposed below the channel layer.

11. The type-switching transistor of claim 1, wherein the plurality of gates are disposed in a lateral direction of the channel layer, and the first gate is disposed in a first position that is lower than the channel layer, and the second gate is disposed in a second position that is higher than the channel layer.

12. The type-switching transistor of claim 11, wherein centers of the first and second gates are disposed in a same vertical line.

13. The type-switching transistor of claim 11, wherein centers of the first and second gates are disposed in different vertical lines.

14. The type-switching transistor of claim 1, wherein a distance between the first and second gates is greater than or equal to 1 nm.

15. A method of operating a type-switching transistor comprising a channel layer, a source electrode that contacts a first region of the channel layer, a drain electrode that contacts a second region of the channel layer, a first gate configured to switch a type of the transistor, and a second gate configured to control characteristics of the channel layer, wherein the first and second gates are disposed on a surface of the channel layer, and wherein at least one of the first and second gates does not overlap the channel layer and the channel layer does not overlap the at least one of the first and second gates, the method comprising:
    switching a type of the transistor to a first type by applying a first voltage to the first gate; and
    driving the transistor using the second gate, the source electrode and the drain electrode.

16. The method of claim 15, further comprising:
    switching the type of the transistor to a second type by applying a second voltage to the first gate; and
    driving the transistor by using the second gate, the source electrode and the drain electrode.

17. An electronic device comprising a type-switching transistor that comprises a channel layer, a source electrode that contacts a first region of the channel layer, a drain electrode that contacts a second region of the channel layer, a first gate configured to switch a type of the transistor, and a second gate configured to control characteristics of the channel layer, wherein the first and second gates are disposed on a surface of the channel layer, and wherein at least one of the first and second gates does not overlap the channel layer and the channel layer does not overlap the at least one of the first and second gates.

18. The electronic device of claim 17, wherein the electronic device comprises a logic device.

19. The electronic device of claim 18, wherein the electronic device comprises an inverter.

20. The electronic device of claim 19, wherein the inverter is a resistor load type inverter comprising the type-switching transistor and a resistor connected to the type-switching transistor.

21. The electronic device of claim 19, wherein, when the type-switching transistor is configured to operate as a first type transistor, the electronic device outputs logic 0 in response to an input of logic 1, and
    wherein when the type-switching transistor is configured to operate as a second type transistor, the electronic device outputs logic 1 in response to an input of logic 1.

22. A logic device comprising:
    a type-switching transistor; and
    a resistor connected to the transistor,
    wherein the type-switching transistor comprises a plurality of gates disposed on a surface of the channel layer, and the plurality of gates comprises a first gate configured to switch a type of the type-switching transistor and a second gate configured to control characteristics of a channel layer,
    wherein at least one of the first and second gates does not overlap the channel layer and the channel layer does not overlap the at least one of the first and second gates,
    wherein when the type-switching transistor is configured as a first type, the logic device outputs logic 0 in response to an input of logic 1, and
    wherein when the type-switching transistor is configured as a second type, the logic device outputs logic 1 in response to the input of logic 1.

23. The logic device of claim 22, wherein the plurality of gates are spaced apart from each other in a horizontal direction.

24. The logic device of claim 22, wherein the plurality of gates are disposed in a lateral direction of the channel layer, and the first gate is disposed in a first position that is lower than the channel layer, and the second gate is disposed in a second position that is higher than the channel layer.

25. The logic device of claim 22, wherein a channel layer of the transistor comprises an ambipolar material.

26. The logic device of claim 25, wherein the channel layer comprises a carbon-based material.

27. The logic device of claim 25, wherein the channel layer comprises a carbon nanotube (CNT).

28. The logic device of claim 25, wherein the channel layer comprises graphene.

29. A type-switching transistor comprising:
    a channel layer;
    a gate insulating layer;
    a source electrode that contacts a first region of the channel layer;
    a drain electrode that contacts a second region of the channel layer;
    a first gate configured to switch a type of the transistor; and
    a second gate configured to control characteristics of the channel layer;
    wherein the first and second gates are disposed in a lateral direction of the channel layer,
    wherein at least one of the first and second gates does not overlap the channel layer and the channel layer does not overlap the at least one of the first and second gates, and wherein the first and second gates are disposed on a first side of the gate insulating layer and the channel layer is disposed on a second side of the gate insulating layer opposite the first side of the gate insulating layer.

30. The type-switching transistor of claim 29, wherein the gate insulating layer is formed from one of a silicon oxide, a silicon oxynitride and a silicon nitride.

31. The type-switching transistor of claim 29, wherein the gate insulating layer is formed of a high-k material having a higher dielectric constant than silicon nitride.

32. The type-switching transistor of claim 29, wherein the gate insulating layer is a single layer structure.

33. The type-switching transistor of claim 29, wherein, if a first voltage is applied to the first gate, the transistor is switched to an N-type transistor, and if a second voltage different from the first voltage is applied to the first gate, the transistor is switched to a P-type transistor.

34. The type-switching transistor of claim 29, wherein when the transistor is switched to an N-type transistor, the channel layer is in an OFF state if a third voltage is applied to the second gate, and the channel layer is in an ON state if a fourth voltage greater than the third voltage is applied to the second gate.

35. The type-switching transistor of claim 29, wherein when the transistor is switched a P-type transistor, the channel layer is in an OFF state if a fifth voltage is applied to the second gate, and the channel layer is in an ON state if a sixth voltage that is smaller than the fifth voltage is applied to the second gate.

* * * * *